United States Patent [19]

Komori et al.

[11] Patent Number: 5,293,060
[45] Date of Patent: Mar. 8, 1994

[54] SEMICONDUCTOR DEVICE WITH DIFFUSION WELL ISOLATION

[75] Inventors: Shigeki Komori; Katsuhiro Tsukamoto, both of Hyogo, Japan

[73] Assignee: Mitsubishi Denki Kabushiki Kaisha, Tokyo, Japan

[21] Appl. No.: 906,890

[22] Filed: Jul. 6, 1992

[30] Foreign Application Priority Data

Jul. 17, 1991 [JP] Japan ............... 3-176982
Apr. 8, 1992 [JP] Japan ............... 4-87330

[51] Int. Cl.$^5$ ............................. H01L 27/02
[52] U.S. Cl. ........................... 257/544; 257/297; 257/372
[58] Field of Search ............... 257/544, 545, 546, 547, 257/548, 549, 297, 369, 371, 372, 376; 437/34, 29

[56] References Cited

U.S. PATENT DOCUMENTS

| | | | |
|---|---|---|---|
| 4,424,526 | 1/1984 | Dennard et al. | 257/297 |
| 4,633,289 | 12/1986 | Chen | 257/372 |
| 5,019,520 | 5/1991 | Komori et al. | 437/34 |
| 5,138,420 | 8/1992 | Komori et al. | 257/371 |
| 5,148,255 | 9/1992 | Nakazato et al. | 257/376 |

OTHER PUBLICATIONS

Yamanaka et al., "A 25 μm$^2$, New Poly-Si PMOS Load (PPL) SRAM Cell Having Excellent Soft Error Immunity," IEEE IEDM 1988, pp. 48–51.

Kiyonori Ohyu et al., "Multilayered Well Formation for Sub–0.5 μm CMOS Devices Utilizing High Energy Ion Implantation", Extended Abstracts of the 21st Conference on Solid State Devices and Materials, Tokyo, 1989, pp. 105–108.

*Primary Examiner*—Rolf Hille
*Assistant Examiner*—Robert Limanek
*Attorney, Agent, or Firm*—Lowe, Price, LeBlanc & Becker

[57] ABSTRACT

A semiconductor device has an upper well of a first conductivity type formed from the surface of an active region separated by an isolation oxide film at the surface of a semiconductor substrate to a predetermined depth. A first conductivity type layer of high concentration is formed along the entire region of an active region to enclose the bottom of the upper well of the first conductivity type. A lower well of the first conductivity type of a predetermined thickness is formed as a buried layer to enclose the bottom of the first conductivity type layer of high concentration. According to this structure, the spreadout of impurities into the active region due to diffusion at the time of thermal treatment is suppressed. The semiconductor device has the wells and the buried layer of high concentration formed by implanting impurities after the step of forming the isolation oxide film, so that diffusion of impurities into the active region due to thermal treatment at the time of isolation oxide film formation is suppressed. As a result, degradation of channel effect is prevented in miniaturization of the semiconductor device.

6 Claims, 16 Drawing Sheets

SEMICONDUCTOR DEVICE WITH DIFFUSION WELL ISOLATION

BACKGROUND OF THE INVENTION

1. Field of the Invention

The present invention relates to a semiconductor device and a method of manufacturing thereof, and more particularly, to a semiconductor device having a well structure for improving element isolation characteristics by preventing interference between adjacent wells.

2. Description of the Background Art

In recent years, miniaturization and larger scale integration are required for semiconductor devices such as DRAMs (Dynamic Random Access Memory) resulting in the employment of a well structure where wells of different conductivity types are formed in an adjacent manner. Such a well structure had a problem that soft errors of DRAMs and latch up of CMOSs (Complementary Metal Oxide Semiconductor) occurred due to interference between adjacent wells. Development in various well structures has been proceeded to prevent interference between such wells.

In "IEDM 88" pp. 48-51, for example, a semiconductor device having a well structure for preventing soft errors of a SRAM (Static Random Access Memory) is disclosed. The wells disclosed in this document are all formed by thermal diffusion steps. In these days of high integration density, it has become difficult to control the impurity concentration distribution of wells by thermal diffusion.

A conventional technique to prevent interference between adjacent wells is known, where a semiconductor device has an impurity layer of high concentration formed beneath an isolation oxide film separating wells from each other at the semiconductor substrate surface.

A conventional semiconductor device will be explained hereinafter with reference to FIG. 14, which has a well structure for preventing interference between adjacent wells. In the well structure of FIG. 14, an n well 2, a p well 3, and an n well 4 are allocated adjacent to each other at respective depths from the surface of a p type silicon substrate 1. Each well is separated by an isolation oxide film 6 at the surface of silicon substrate 1. A p well 5 is formed inside n well 4. For the purpose of improving the isolation characteristic between the wells, an n type layer 7 of high concentration, a p type layer 8 of high concentration, an n type layer 9, and a p type layer 10 of high concentration are formed in n well 2, p well 3, n well 4, and p well 5, respectively, beneath the isolation oxide film.

The manufacturing steps of the above-mentioned semiconductor device having a conventional well structure will be described hereinafter with reference to FIGS. 15-26.

A resist film 11 is formed on the main surface of p type silicon substrate 1 to have an opening only at the region where n well 4 is to be formed. Phosphorus which is impurity of n type is implanted at a predetermined implantation energy and dosage (FIG. 15) to form n well 4 (FIG. 16).

A resist film 12 is then formed having an opening at the region where n well 2 is to be formed. Phosphorus is implanted at an implantation energy that is lower than that used for forming n well 4 (FIG. 17) to result in well 2 (FIG. 18).

Next, resist film 13 is formed having an opening only at the region where p wells 3 and 5 are to be formed. Boron which is an impurity of p type is implanted (FIG. 19) to form p wells 3 and 5 (FIG. 20).

Oxide film 14 and silicon nitride film ($Si_3N_4$ film) 15 are formed all over the main surface of semiconductor substrate 1 (FIG. 21). Silicon nitride film 15 is patterned by photolithography and etching (FIG. 22). Then, resist film 16 is formed to cover the surface of n wells 2 and 4. Boron is implanted (FIG. 23) to form p type layers 8 and 10 of high concentration partially at the surface of p wells 3 and 5.

Resist film 16 is removed, and resist film 17 is formed to cover the surface of p wells 3 and 5 (FIG. 24). Phosphorus is implanted to form n type layers 7 and 9 of high concentration at the surface of n wells 2 and 4, respectively. Then, resist film 17 is removed (FIG. 25).

Isolation oxide film 6 is formed by thermal oxidation to result in the structure shown in FIGS. 26 and 14.

The above-described conventional well structure and manufacturing method had the following problems.

High concentration n type layer 7 and high concentration p type layers 8 and 10 right beneath isolation oxide film 6 are formed prior to the isolation oxide film 6 formation step for element isolation enhancement. Impurities of high concentration n type layer 7 or high concentration p type layers 8 and 10 will spread out into the active regions of each well at the time of thermal diffusion due to the high temperature of the thermal treatment for forming isolation oxide film 6. If the channel width of the transistor formed in these active regions is small, the threshold voltage $V_{th}$ will become too high to yield the disadvantage that the transistor does not operate properly, due to the high concentration of impurities in the active region. This was a great disadvantage in the miniaturization of the device for increasing storage capacity. This disadvantageous phenomenon is called "narrow channel effect".

The conventional well structure shown in FIG. 14 also had the following problem. It can be appreciated from FIG. 27A that semiconductor substrate 1 and n well 4, and n well 4 and p well 5 are respectively isolated from each other by pn junctions, with a junction capacitance of $C_1$ and $C_2$ at each pn junction. This means that although these pn junctions are separated regarding the direct current component of current, electrical connection is established regarding alternating-current component. Therefore, if n well 4 has supply voltage Vcc applied with a high frequency noise $V_N(t)$, the high frequency noise $V_N(t)$ will appear as the difference between potential $V_5$ of p well 5 and potential $V_1$ of semiconductor substrate 1. In the conventional well structure of FIG. 27A, the p type impurity concentration of semiconductor substrate 1 right beneath n well 4 is relatively low so that a depletion layer is easily generated in the semiconductor substrate 1 side at the pn junction formed by n well 4 and semiconductor substrate 1. This reduces junction capacitance $C_1$, whereby most of the high frequency noise $V_N(t)$ results in a fluctuation of potential $V_5$ of p well 5. This induced the problems that information stored in the memory formed on p well 5 was lost and the operation of other elements were unstable.

SUMMARY OF THE INVENTION

An object of the present invention is to provide a well structure having element isolation enhancement means applicable to miniaturization and larger scale integration, and a method of manufacturing thereof.

Another object of the present invention is to protect a semiconductor device against narrow channel effect by preventing impurities from thermally diffusing into an active region.

Still another object of the present invention is to provide a semiconductor device having a well structure of superior insulation to high frequency noise superimposed on the supply voltage.

A semiconductor device of the present invention for achieving the above objects includes: a semiconductor substrate; an isolation oxide film formed on a surface of the semiconductor substrate to separate an active region; an upper well of a first conductivity type formed to a predetermined depth from the surface of the active region separated by the isolation oxide film; a first conductivity type layer formed as a buried layer extending continuously along the entire active region beneath the upper well of the first conductivity type; and a lower well of the first conductivity type of a predetermined thickness formed as a buried layer extending along the entire active region beneath the first conductivity type layer. The first conductivity type layer has a concentration higher than that of the upper well of the first conductivity type.

The semiconductor device is improved in element isolation enhancement of a well by a first conductivity type layer of high concentration which encloses the bottom of the upper well of the first conductivity type and which has the periphery adjacent to the bottom of the isolation oxide film. This first conductivity type layer of high concentration differs from a conventional high concentration impurity layer formed beneath the isolation oxide film extending to the active region in that a relatively long distance from the active region is established. This prevents the impurities due to diffusion of thermal treatment from dispersing into the active region, whereby the rise in threshold voltage of the active region is also suppressed.

According to another aspect of the present invention, the semiconductor device further includes a second conductivity type well of a predetermined thickness formed as a buried layer to enclose the bottom and the circumferential side of the lower well of the first conductivity type and the outer circumferential sides of the upper well of the first conductivity type and the first conductivity type layer of high concentration; and a first conductivity type buried layer of high concentration of a predetermined thickness formed as a buried layer in the region at least beneath the second conductivity type well to be adjacent to the entire bottom of the second conductivity type well.

According to this structure, the generation of a depletion layer is suppressed in the pn junction formed between the second conductivity type well and the first conductivity type buried layer of high concentration. The junction capacitance thereof is increased so that the ratio to the upper well of the first conductivity type of the high frequency noise component of supply voltage applied to the second conductivity type well is reduced. Thus, fluctuation in the potential of the upper well of the first conductivity type is suppressed.

A method of manufacturing the above-described semiconductor device of the present invention includes the following steps. First, an isolation oxide film at the surface of a semiconductor substrate for separating active regions is formed and, then, implanting impurities of a first conductivity type into the semiconductor substrate surface are implanted at a predetermined implantation energy and dosage for forming a lower well of the first conductivity type of a predetermined thickness at a predetermined depth along the entirety of active region. Then, impurities of the first conductivity type are implanted at an implantation energy that is lower than when the lower well of the first conductivity type was formed to provide a first conductivity type layer of high concentration along the entirety of the active region adjacent to the upper face of the lower well of the first conductivity type.

According to another aspect of the present invention, the method of manufacturing a semiconductor device further includes the following steps. A second conductivity type well is formed to enclose the bottom and the outer circumferential sidewall of the lower well of the first conductivity type and the outer circumferential sidewalls of the upper well of the first conductivity type and the first conductivity type layer of high concentration by implanting impurities of the second conductivity type at a predetermined implantation energy and dosage, after the step of forming an isolation oxide film and before the step of forming a lower well of the first conductivity type. Then, a first conductivity type buried layer of high concentration to be adjacent at least to the bottom of the entire region of the second conductivity type well is formed by implanting impurities of the first conductivity type at a predetermined implantation energy and dosage, after the step of forming an isolation oxide film, and before the step of forming the second conductivity type well.

According to the above-described method of manufacturing a semiconductor device, the phenomenon of impurities penetrating into the active region by thermal treatment at the time of isolation oxide film formation is prevented by first forming an isolation oxide film to separate the active region, and then implanting impurities for the formation of each well and a high concentration buried layer. The spreadout of impurities into the active region will be reliably prevented since the first conductivity type wells are formed as buried layers and not by thermal diffusion.

Thus, according to the present invention, a well structure can be provided suitable for high integration density and for preventing degradation of channel characteristic caused by the spreadout of impurities into the active region, by means of an impurity layer of high concentration in the well adjacent the bottom surface of the isolation oxide film and extending continuously along the entirety of the active region.

With a well structure of a first conductivity type well having the bottom and the outer circumferential sidewalls enclosed by a second conductivity type well, and having a first conductivity type buried layer of high concentration of a conductivity type identical to that of the semiconductor substrate adjacent to the bottom of the second conductivity type well, fluctuation of potential of the first conductivity type well due to the influence of noise components accompanying the supply voltage applied to the second conductivity type well can be suppressed to prevent degradation of element characteristic.

According to the method of manufacturing a semiconductor device of the present invention, the phenomenon of diffusion of impurities into the active region due to high temperature at the time of thermal treatment is suppressed to prevent degradation of channel characteristic conforming to miniaturization, because the formation of the isolation oxide film is carried out before the formation of the wells, with the formation of the well implemented as a buried layer without the thermal diffusion step.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The well structure of a semiconductor device according to a first embodiment of the present invention will be explained hereinafter with reference to FIG. 1.

Figure 1:
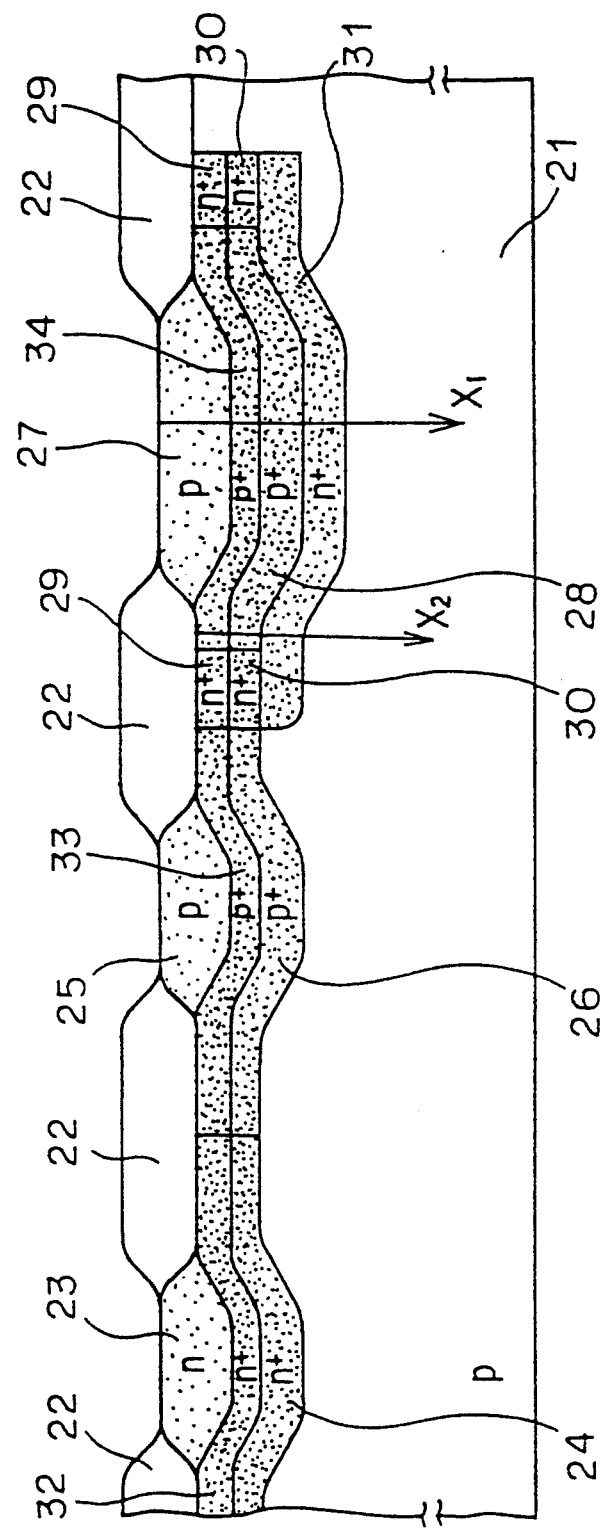
FIG. 1 is a sectional view of a well structure of a semiconductor device according to a first embodiment of the present invention.

Referring to FIG. 1, the semiconductor device of the present invention comprises upper and lower layers of n wells 23 and 24, upper and lower layers of p wells 25 and 26, and upper and lower layers of p wells 27 and 28 formed in the regions respectively separated by an isolation oxide film 22 at the main surface of a p type silicon substrate 21 which is the semiconductor substrate.

High concentration n type layer 32, high concentration p type layer 33, and high concentration p type layer 34 are formed at the concentration of approximately $10^{16}$–$10^{22}$/cm$^3$ between n wells 23 and 24, p wells 25 and 26, and p wells 27 and 28, respectively, right beneath isolation oxide film 22 to the entire region of each well to improve the isolation characteristic of each active region.

The sidewalls of high concentration p type layer 34 and p well 28, and the bottom of p well 28 are enclosed by n wells 29, 30, and 31, respectively, of high concentration to ensure isolation between p wells 25 and 27, and between p wells 26 and 28. The p type impurity concentration of p wells 25, 26, 27 and 28 is approximately $10^{15}$–$10^{18}$/cm$^3$. The n type impurity concentration of n wells 29, 30, and 31 is approximately $10^{16}$–$10^{19}$/cm$^3$.

Figure 2:
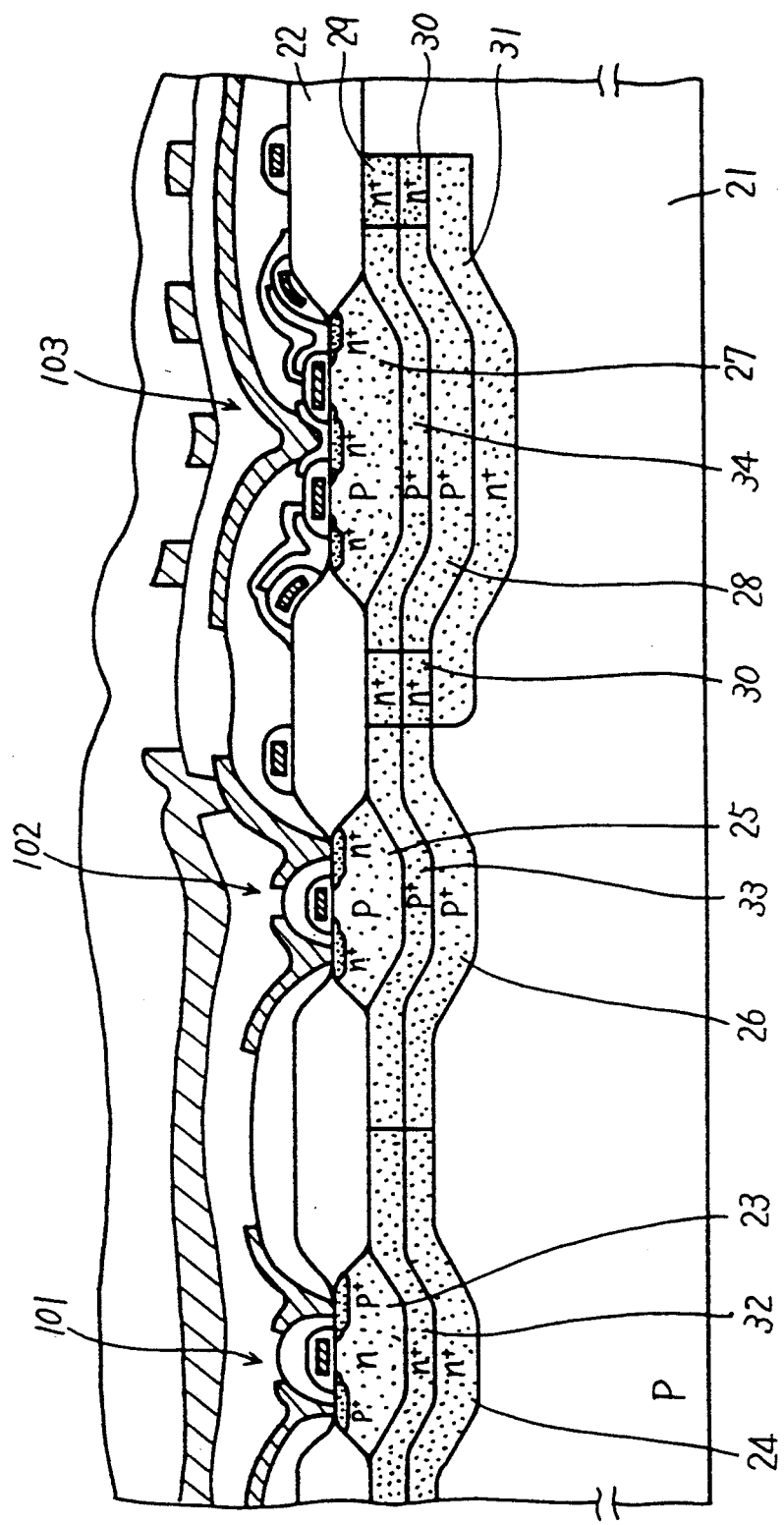
FIG. 2 is a sectional view showing a case where a semiconductor element is formed on the well having the structure of FIG. 1.

The well structure of FIG. 1 is applied to the semiconductor device shown in FIG. 2, for example. The semiconductor device of FIG. 2 has a p channel transistor 101 and an n channel transistor 102 formed on n well 23 and p well 25, respectively. Memory cells 103 of DRAM are formed on p well 27.

The semiconductor device of such a structure has superior isolation characteristic of p well 27 on which memory cells 103 are formed, so that soft error occurring in implanting carriers to the capacitor of memory cell 103 is prevented to improve the element characteristic.

The manufacturing step of the semiconductor device of the present embodiment will be explained hereinafter with reference to FIGS. 3–8.

Figure 3:
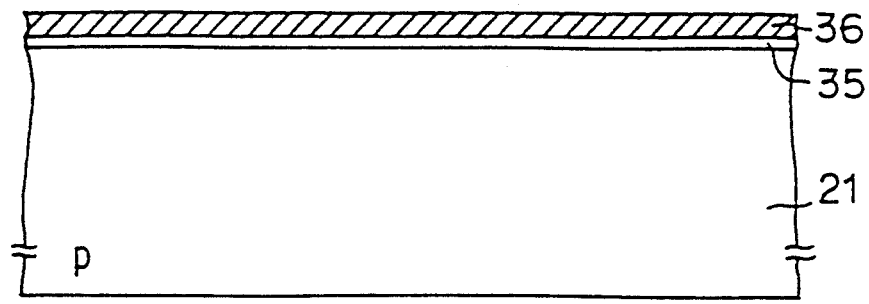
FIG. 3 is a sectional view of the semiconductor device of the first embodiment of FIG. 1 showing the first manufacturing step for forming the well structure.
Figure 4:
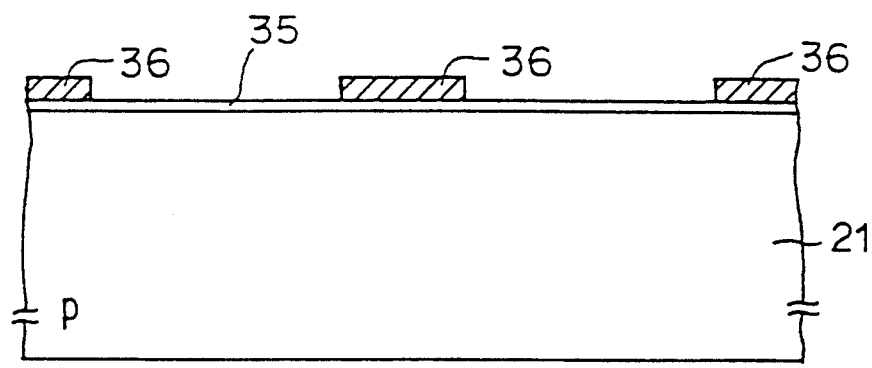
FIG. 4 is a sectional view of the semiconductor device of the first embodiment showing a second manufacturing step.
Figure 5:
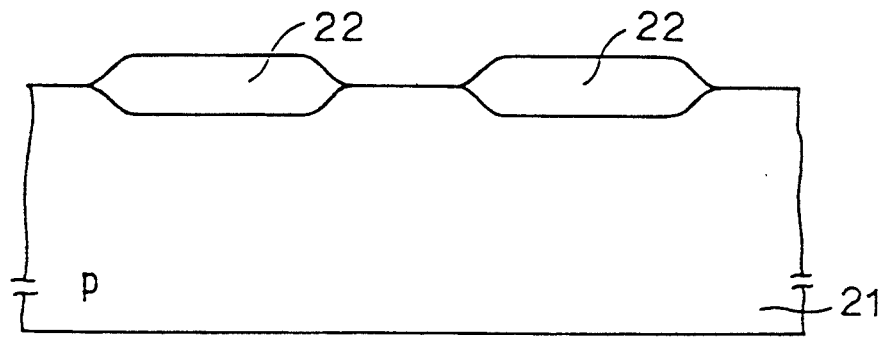
FIG. 5 is a sectional view of the semiconductor device of the first embodiment showing the third manufacturing step.

An oxide film 35 of approximately 500 Å thickness is formed by thermal oxidation all over the main surface of p type silicon substrate 21. A silicon nitride film 36 is formed thereupon by the CVD method to a thickness of approximately 1000 Å (FIG. 3). Silicon nitride film 36 is patterned by photolithography and etching (FIG. 4), whereby thermal oxidation is applied at an atmosphere of 900° C.–1000° C. to form isolation oxide film 22. Then, silicon nitride film 36 is removed (FIG. 5).

Figure 6:
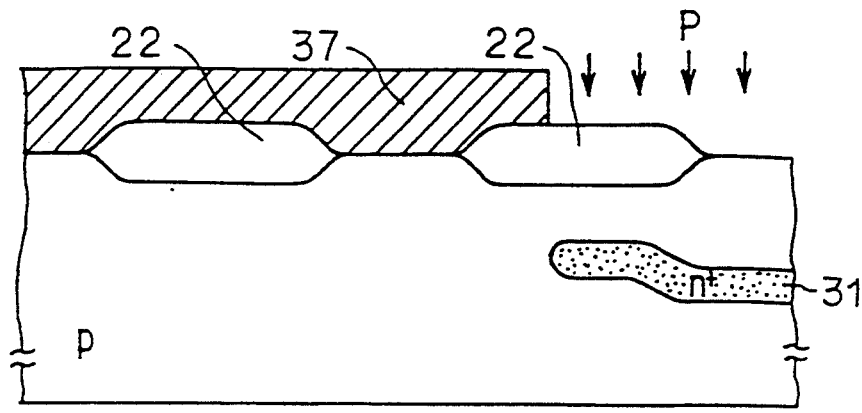
FIG. 6 is a sectional view of the semiconductor device of the first embodiment showing the fourth manufacturing step.

Then, resist film 37 is formed to have an opening only at the region where n well 31 is to be formed. Phosphorus is implanted under the conditions of an implantation energy of 2–6 MeV, and a dosage of $1\times10^{12}$–$1\times10^{16}$/cm$^2$ to form n well 31 at a predetermined depth within silicon substrate 21 (FIG. 6).

Figure 7:
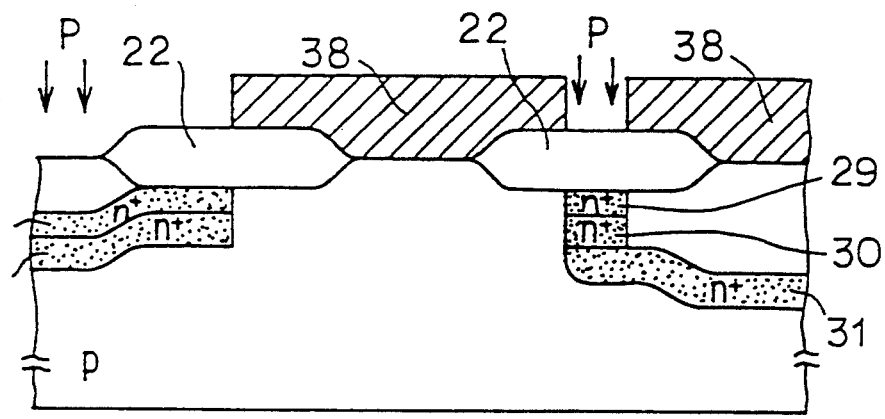
FIG. 7 is a sectional view of the semiconductor device of the first embodiment showing the fifth manufacturing step.

After resist film 37 is removed, resist film 38 is formed to have an opening only in the regions where n wells 24 and 30 are to be formed. Phosphorus is implanted under the conditions of an implantation energy of 500 KeV–3 MeV and a dosage of $1\times10^{12}$–$1\times10^{16}$/cm$^2$ to form n wells 24 and 30. Next, phosphorus is implanted under the conditions of an implantation energy of 200 KeV–1 MeV and dosage of $1\times10^{11}$–$1\times10^{15}$/cm$^2$, to form n type layers 29 and 32 of high concentration (FIG. 7).

Figure 8:
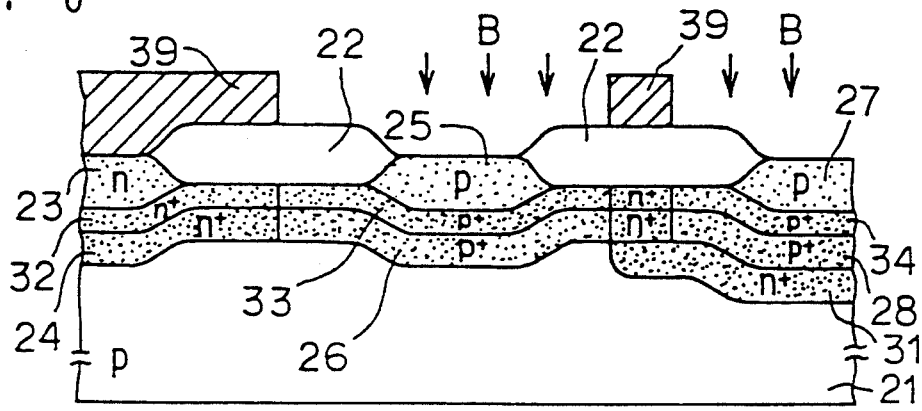
FIG. 8 is a sectional view of the semiconductor device of the first embodiment showing the sixth manufacturing step.

Resist film 38 is then removed, followed by the formation of resist film 39 having an opening only at the region where p wells 26 and 28 are to be formed. Boron is then implanted under the conditions of 300 KeV–3 MeV and $1\times10^{12}$–$1\times10^{16}$/cm$^2$ to form p wells 26 and 28. Next, boron is again implanted under the condition of 50 KeV–1 MeV and $1\times10^{11}$–$1\times10^{15}$/cm$^2$ to form p type layers 33 and 34 of high concentration. Furthermore, boron is implanted at 5–100 KeV and $1\times10^{10}$–$1\times10^{15}$/cm$^2$ to form p wells 25 and 27 (FIG. 8).

Figure 9A:
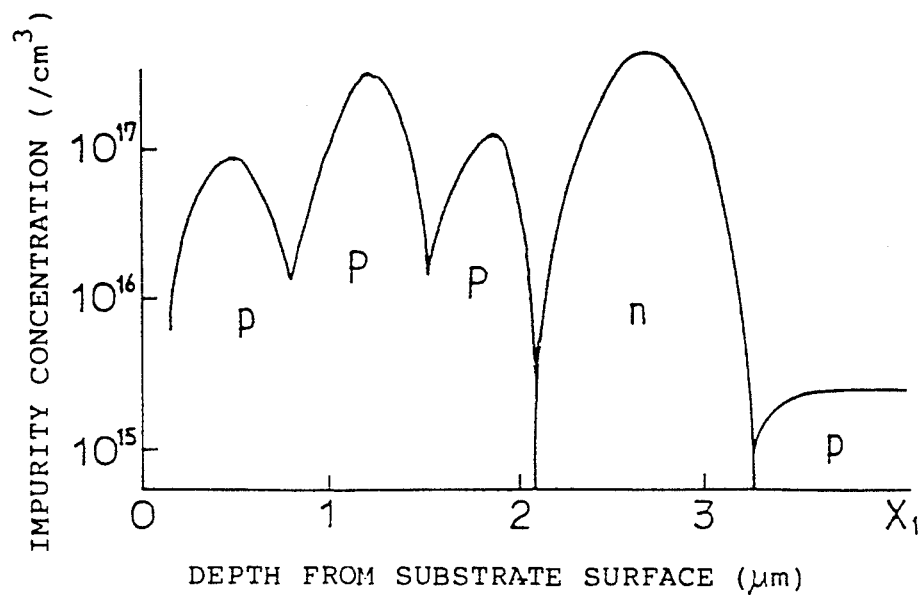
FIG. 9A is a graph showing the impurity concentration distribution in the direction of arrow $X_1$ of the well structure of the semiconductor device of the first embodiment of the present invention shown in FIG. 1.
Figure 9B:
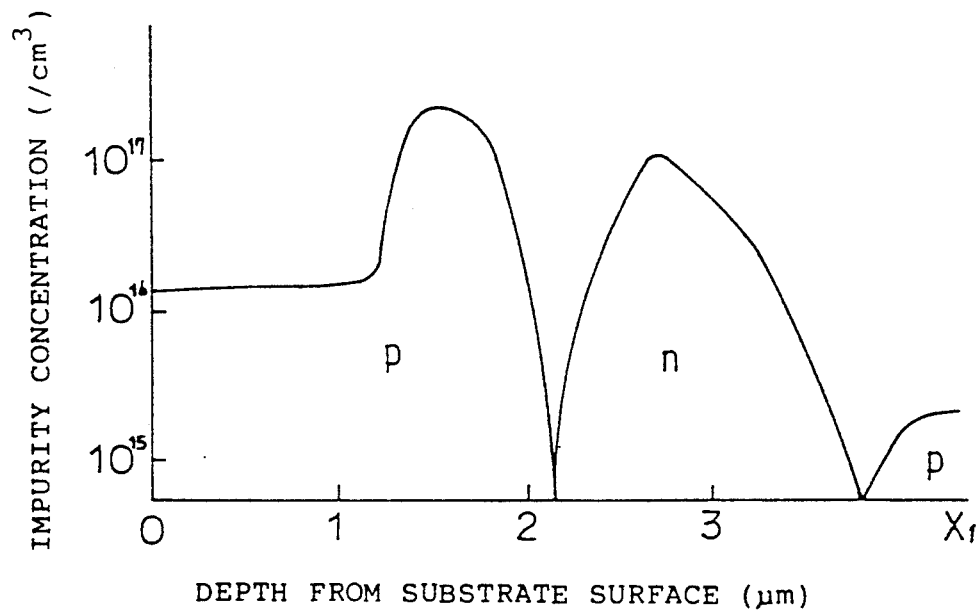
FIG. 9B is a graph showing the impurity concentration distribution in the direction of arrow $X_1$ of the well structure of the conventional semiconductor device of FIG. 14.
Figure 14:
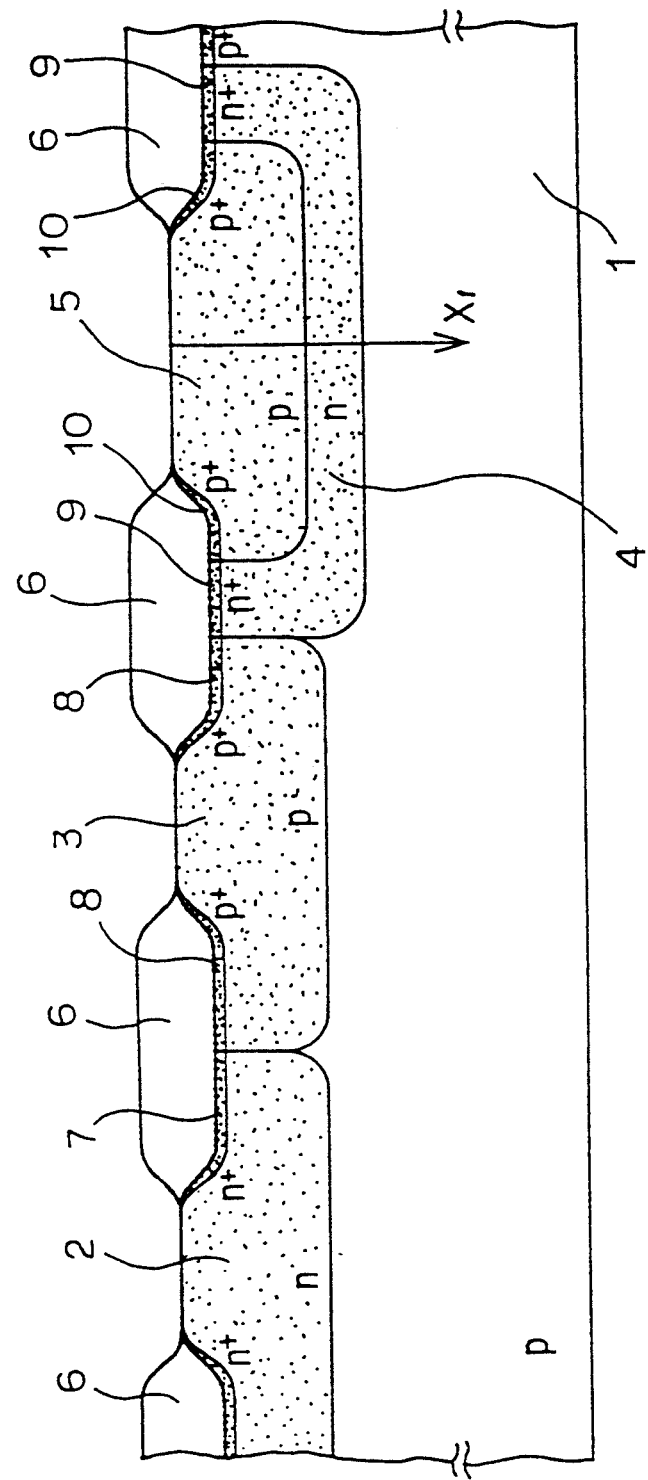
FIG. 14 is a sectional view of a well structure of a conventional semiconductor device.
Figure 15:
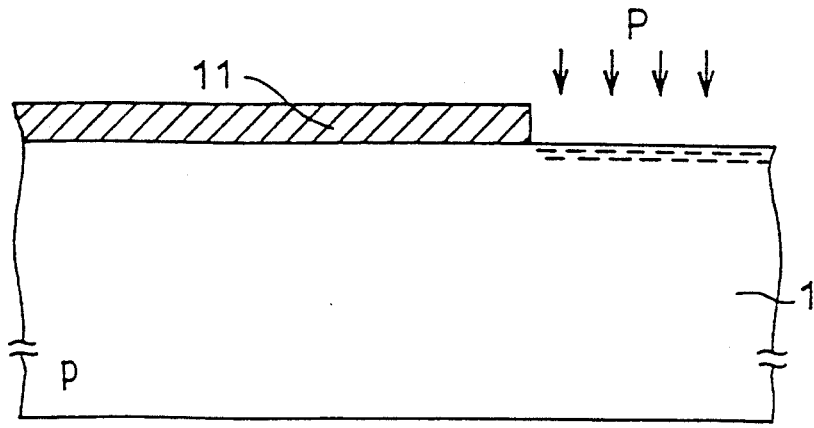
FIG. 15 is a sectional view of the conventional semiconductor device of FIG. 14 showing the first manufacturing step for forming a well structure.
Figure 16:
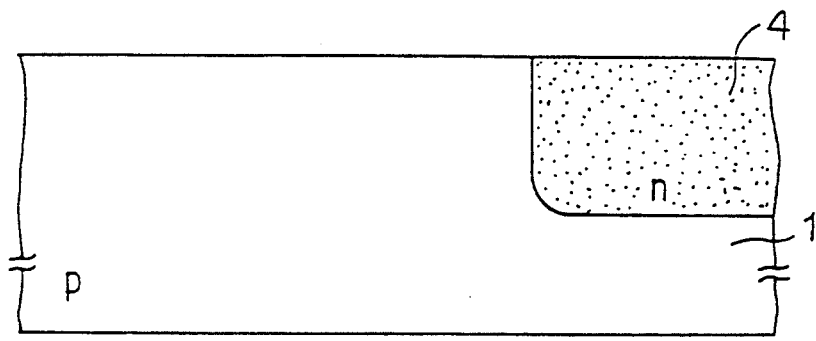
FIG. 16 is a sectional view of the conventional semiconductor device showing a second manufacturing step.
Figure 17:
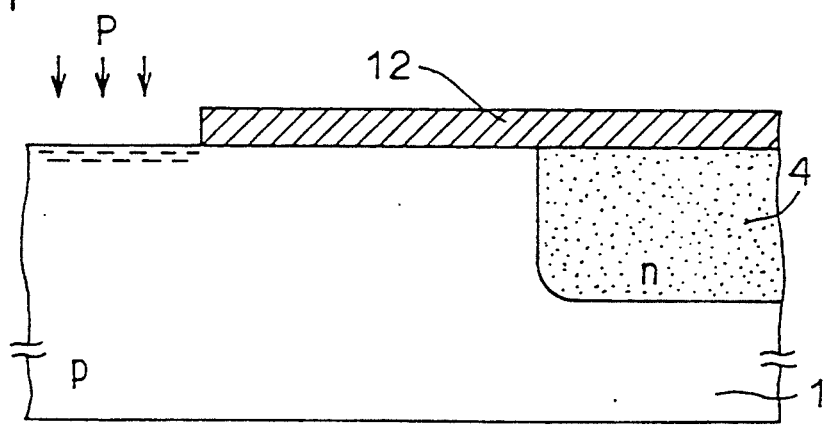
FIG. 17 is a sectional view of the conventional semiconductor device showing the third manufacturing step.
Figure 18:
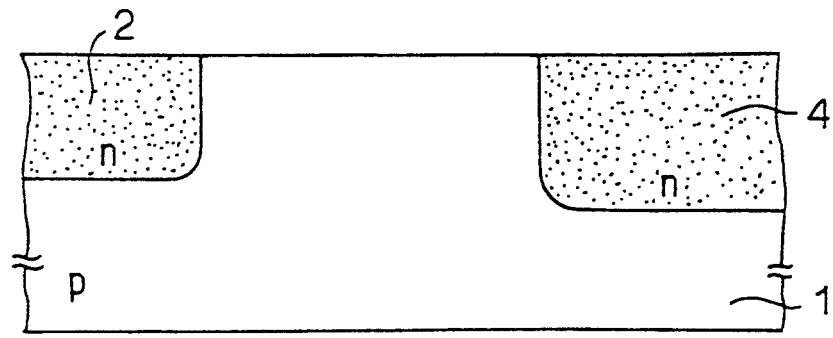
FIG. 18 is a sectional view of the conventional semiconductor device showing the fourth manufacturing step.
Figure 19:
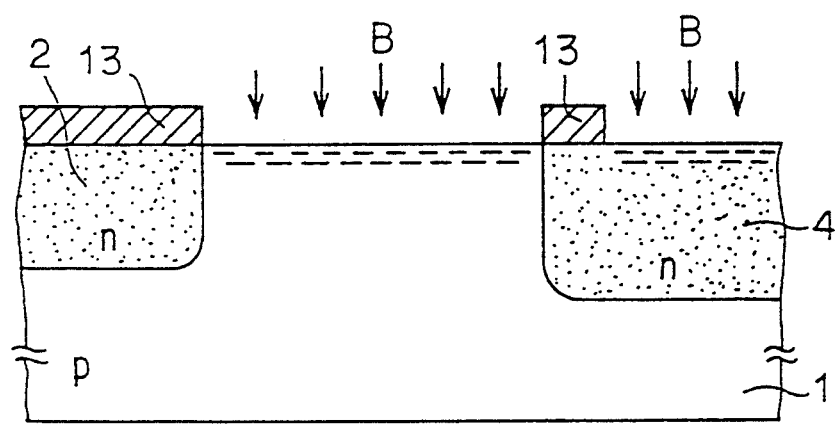
FIG. 19 is a sectional view of the conventional semiconductor device showing the fifth manufacturing step.
Figure 20:
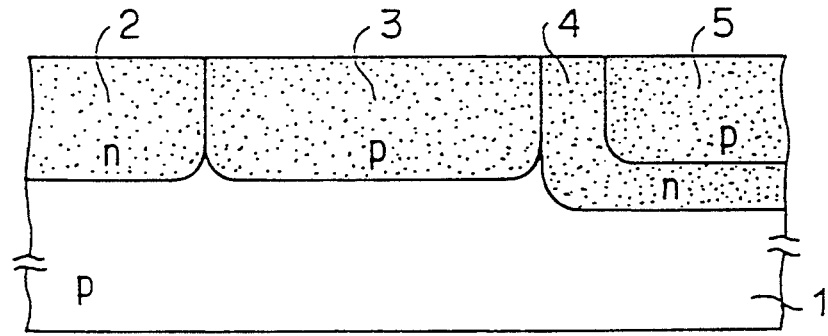
FIG. 20 is a sectional view of the conventional semiconductor device showing the sixth manufacturing step.
Figure 21:
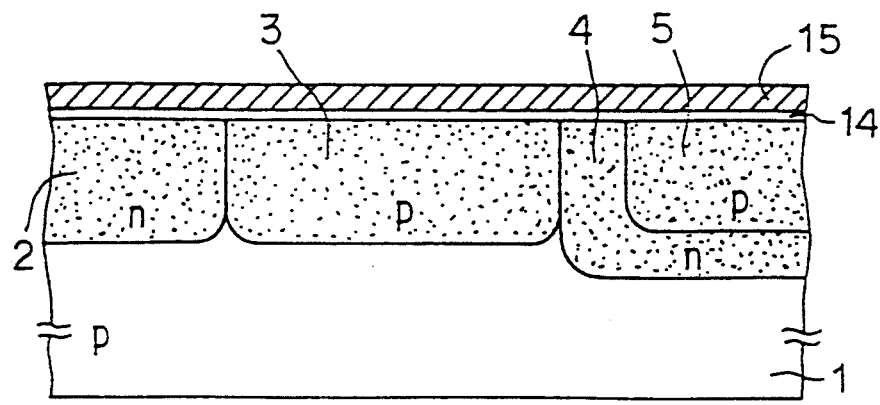
FIG. 21 is a sectional view of the conventional semiconductor device showing the seventh manufacturing step.
Figure 22:
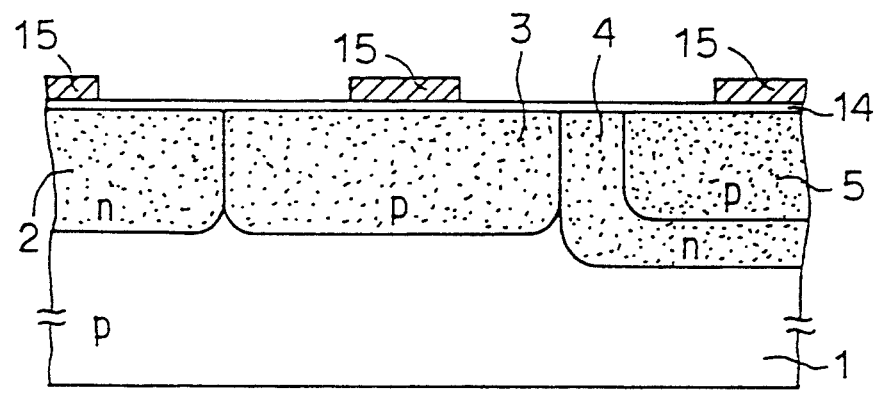
FIG. 22 is a sectional view of the conventional semiconductor device showing the eighth manufacturing step.
Figure 23:
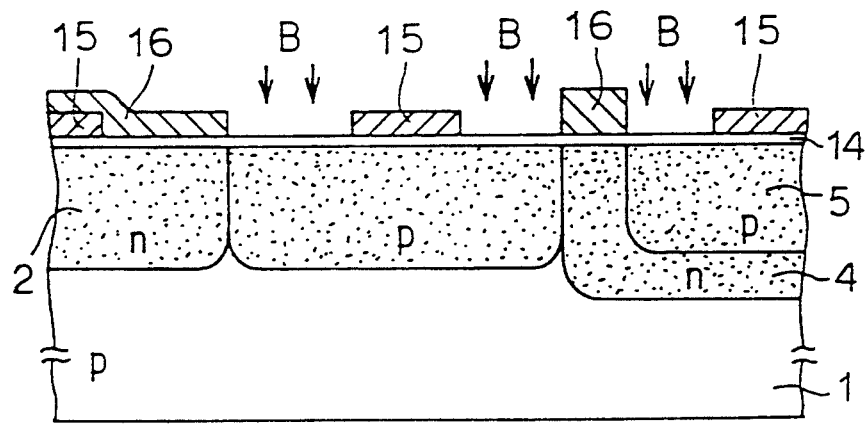
FIG. 23 is a sectional view of the conventional semiconductor device showing the ninth manufacturing step.
Figure 24:
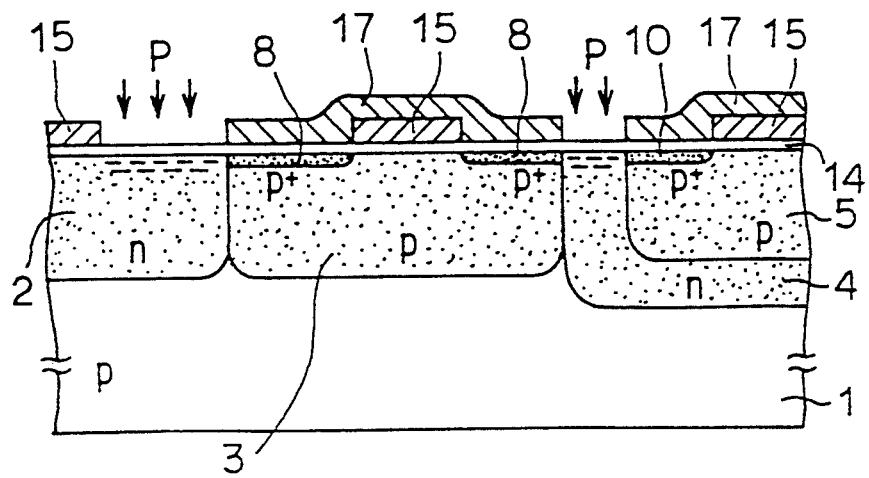
FIG. 24 is a sectional view of the conventional semiconductor device showing the tenth manufacturing step.
Figure 25:
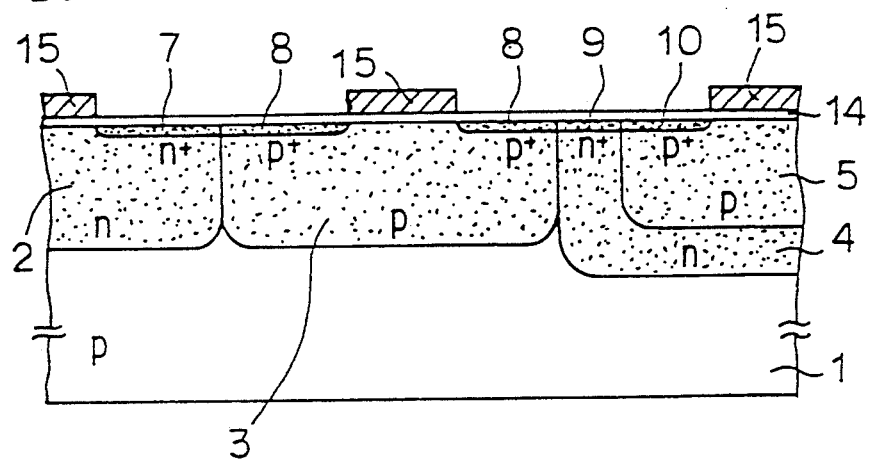
FIG. 25 is a sectional view of the conventional semiconductor device showing the eleventh manufacturing step.
Figure 26:
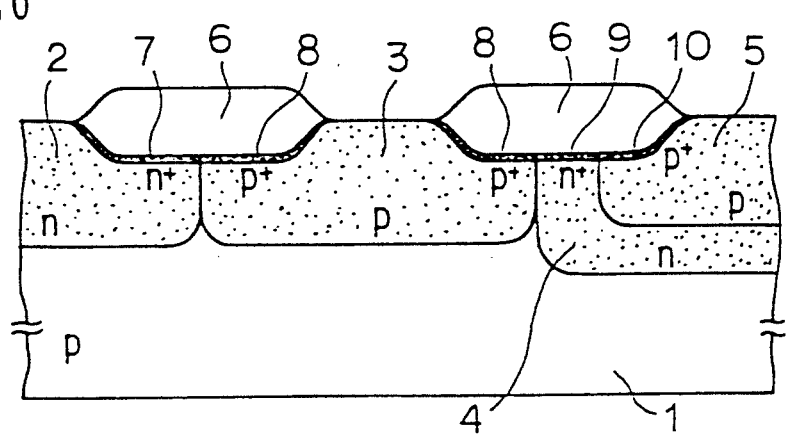
FIG. 26 is a sectional view of the conventional semiconductor device showing the twelfth manufacturing step.

In the well structure of the semiconductor device of the present embodiment, the impurity concentration distribution in the depth direction shown by arrow $X_1$ of FIG. 1 is as shown in FIG. 9A, while the impurity concentration distribution in the depth direction shown by arrow $X_1$ of the conventional well structure of FIG. 14 is as shown in FIG. 9B. It can be appreciated from FIGS. 9A and 9B that there is a plane concentration distribution of low concentration in the proximity of the surface of silicon substrate 1 in the conventional well structure, whereas such a plane concentration distribution does not exist in the present embodiment. The impurity concentration distribution of p type has a peak in the proximity of the surface of the silicon substrate in the present embodiment.

Figure 28A:
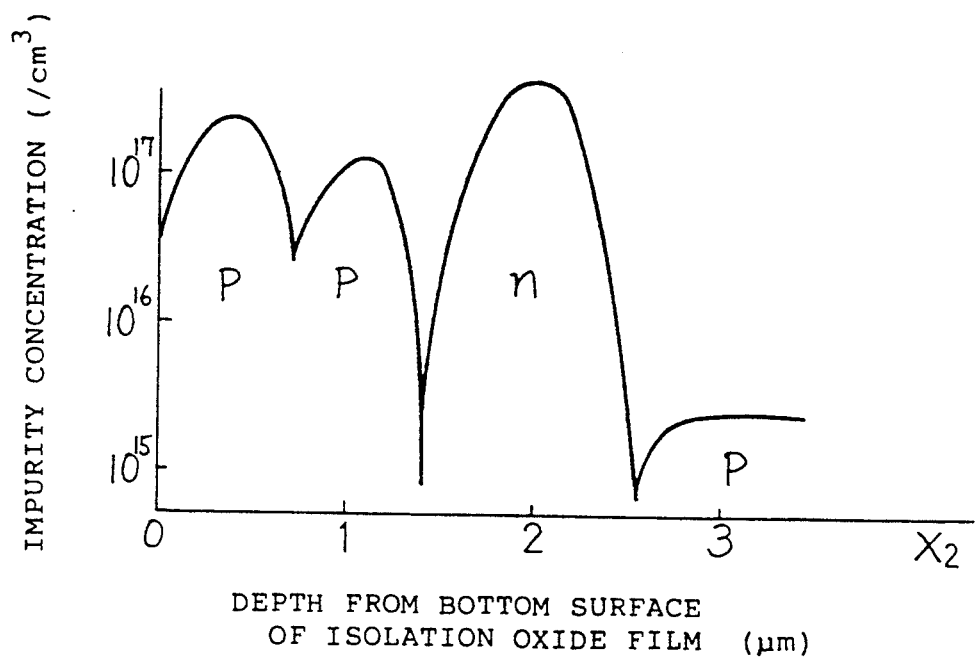
FIG. 28A is a graph showing the impurity concentration distribution in the direction of arrow $X_2$ of the well structure of the semiconductor device of the first embodiment of the present invention shown in FIG. 1.
Figure 28B:
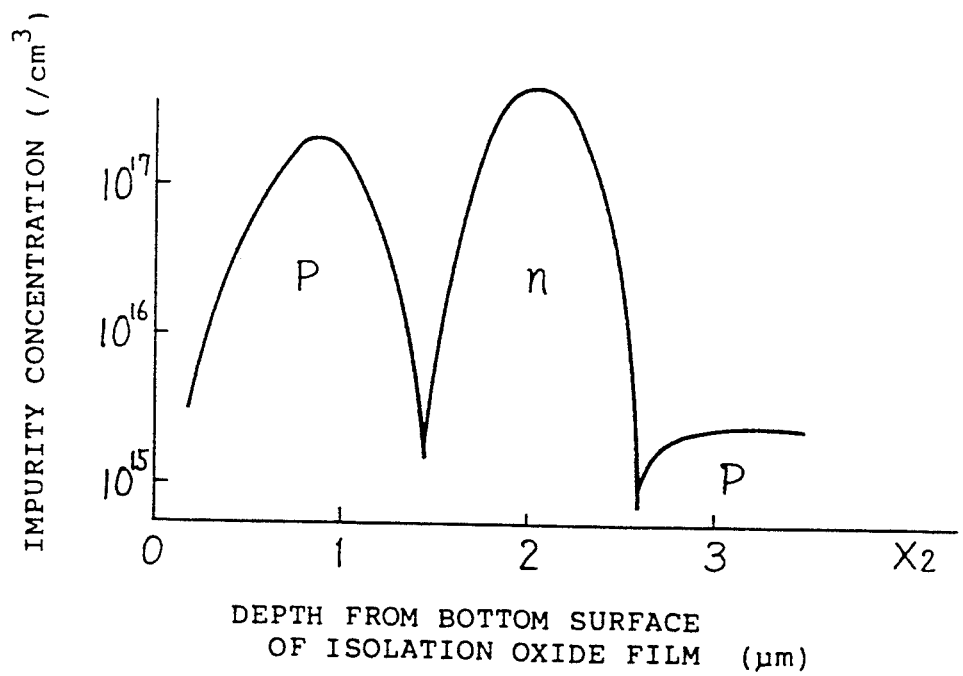
FIG. 28B is a graph showing the impurity concentration distribution in the direction of arrow $X_2$ similar to that shown in FIG. 28A on the assumption that the first conductivity type layer 34 and p well 28 are formed through a single impurity implantation step.

In the area right under the isolation oxide film 22 in the direction of arrow $X_2$ shown in FIG. 1 outside the circumference of the p well 27, the impurity concentration distribution in the depth direction shown by arrow $X_2$ is as shown in FIG. 28A. The p type layer 34 and p well 28 are formed by two step impurity implantation and, therefore, the peaks of the p type impurity concentration are positioned right under insulation oxide film 22 and at another deeper area respectively, high concentration of impurity distribution is kept in comparatively wide range of the depth direction, In case p player 34 and p well 28 are formed as one layer by one impurity implantation step, however, the peak of p type impurity concentration distribution is positioned in deep area as shown in FIG. 28B, the p type impurity concentration is rather low at the area right under insulation oxide film 22 and, therefore, the function to reinforce element insulation can not be performed enough.

Consequently, the present embodiment having such a well structure shown in FIGS. 9A and 28A can have the element isolation characteristic of p well 27 enhanced by high concentration p type layer 34 without providing a high concentration p type layer beneath isolation oxide film 22 in the proximity of the active layer. Therefore, the distance between high concentration p type layer 34 and the active region surface is ensured so that diffusion of p type impurities into the surface of the active layer is prevented.

High concentration n well 24, p well 26 and 28, and n well 30 are all formed as buried layers without the usage of thermal diffusion to prevent impurities due to the influence of thermal diffusion step for the well formation from spreading out into the active region.

Therefore, the disadvantage of a rise in the threshold voltage in the active region is suppressed even where miniaturization is required, resulting in a well structure suitable for high integration density.

Figure 10A:
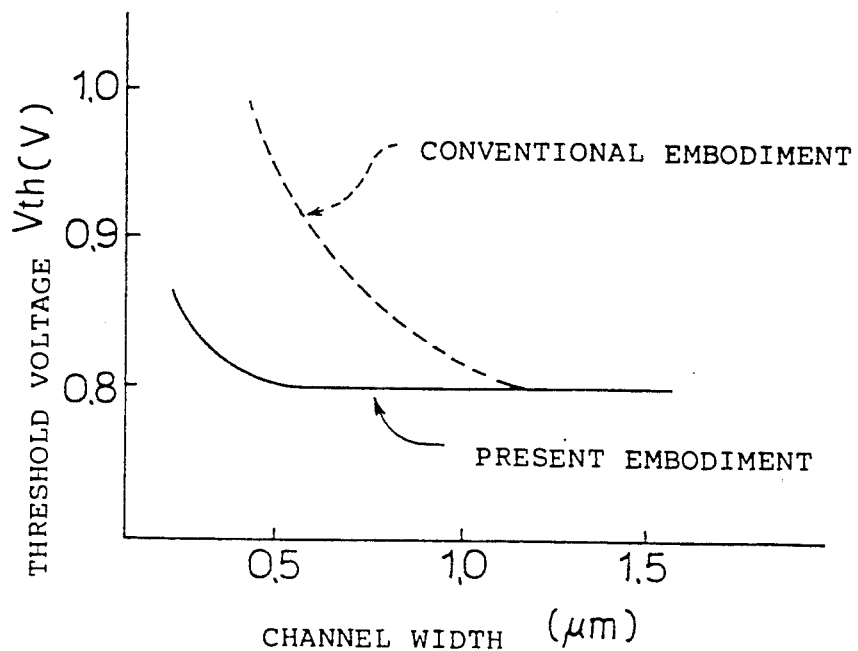
FIG. 10A is a graph showing the narrow channel effect of the first embodiment of the present invention and a conventional one.
Figure 10B:
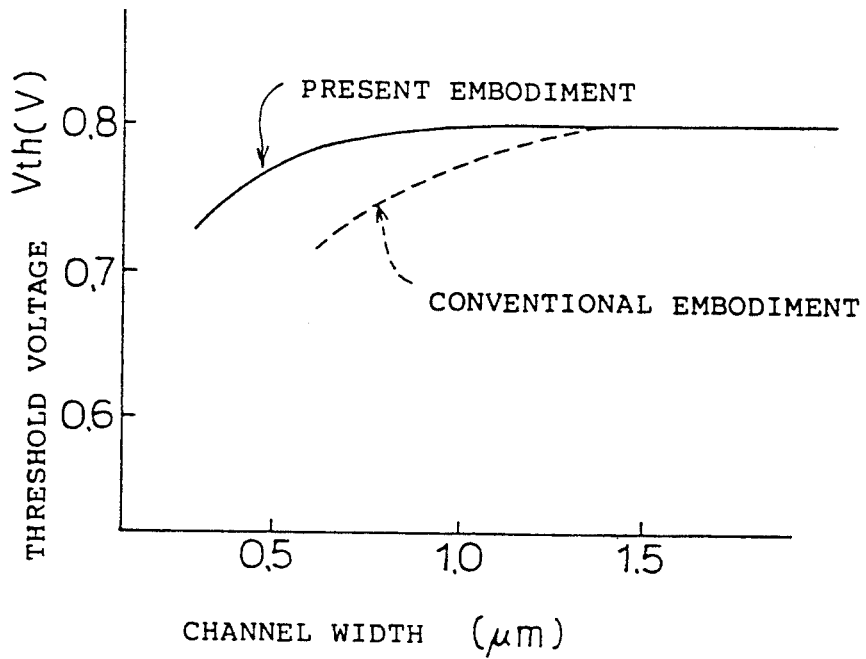
FIG. 10B is a graph showing the short channel effect of the first embodiment of the present invention and a conventional one.

To describe the effect of the present invention, the relationship between the channel width and the threshold voltage, and the relationship between the channel length and the threshold voltage are shown in the graphs of FIGS. 10A and 10B comparing the present embodiment with a conventional embodiment. In FIG. 10B, the backgate voltage of the present embodiment is 0 V and that of the conventional embodiment is $-3$ V. It is appreciated from FIG. 10A that the so-called narrow channel effect where threshold voltage rises in proportion to the decrease of channel width is suppressed significantly in the present embodiment in comparison with the case of the conventional embodiment. It is also appreciated from FIG. 10B that the so-called short channel effect where threshold voltage is decreased in proportion to the reduction of channel length is suppressed in the present embodiment.

The second embodiment of the present invention will be explained hereinafter with reference to FIG. 11 and FIGS. 12A–12C.

Figure 11:
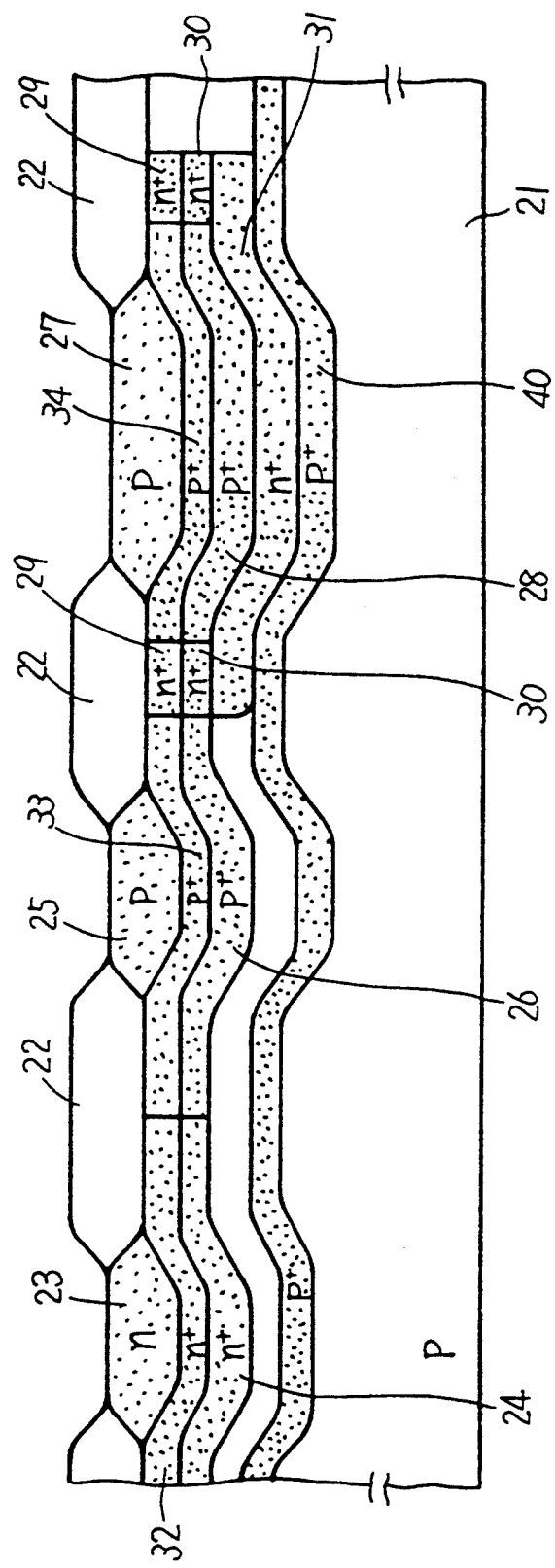
FIG. 11 is a sectional view of the well structure of a semiconductor device according to a second embodiment of the present invention.

The well structure of the present embodiment has a high concentration buried layer (referred to as "high concentration p type buried layer" hereinafter) 40 at a depth adjacent to the bottom of n well 31, and having a conductivity type identical to that of semiconductor substrate 21 (p type in the present embodiment), as shown in FIG. 11. High concentration p type buried layer 40 is electrically connected to semiconductor substrate 21 since the bottom thereof is adjacent to the p type region of semiconductor substrate 21. This means that high concentration p type buried layer 40 has the potential of the substrate applied. High concentration p type buried layer 40 has a high p type impurity concentration of approximately $10^{16}/cm^3$–$10^{22}/cm^3$, whereas semiconductor substrate 21 has a p type impurity concentration of approximately $10^{15}/cm^3$.

Figure 12A:
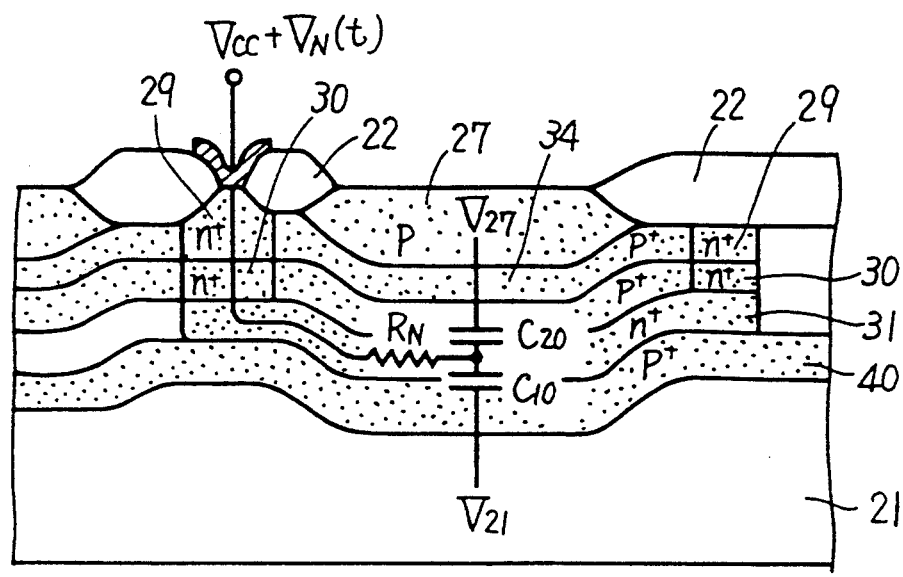
FIG. 12A is a sectional view of the well structure of FIG. 1 including an equivalent circuit diagram for describing the potential fluctuation of p well 27 due to the influence of noise component $V_N(t)$ accompanying supply voltage $V_{CC}$ applied to n well 29.
Figure 27A:
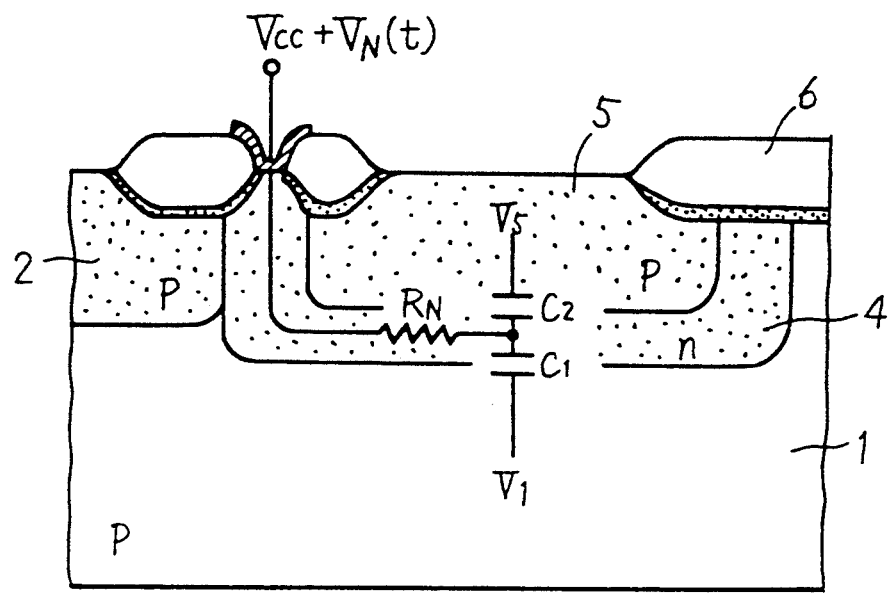
FIG. 27A is a sectional view of the conventional well structure of FIG. 14 including an equivalent circuit diagram for describing the fluctuation of potential of p well 5 due to the influence of noise component $V_N(t)$ accompanying supply voltage $V_{CC}$ applied to n well 4.
Figure 27B:
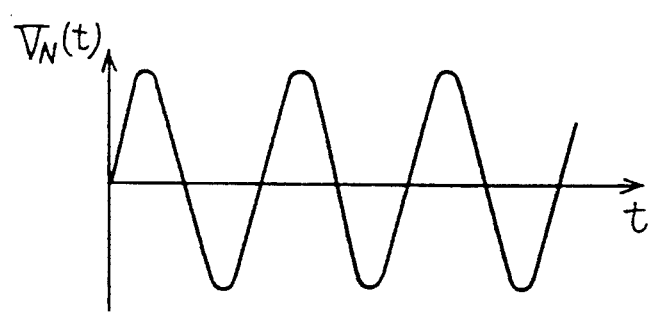
FIG. 27B is a graph showing the fluctuation of noise component $V_N(t)$.

Referring to FIG. 12A, n well 29 has supply voltage $V_{CC}$ applied, and semiconductor substrate 21 has 0 volt or a negative bias potential $V_{21}$ applied. Therefore, there is some level of depletion layer at the pn junction between n well 31 and high concentration p type buried layer 40. Assuming that the junction capacitance of this pn junction is $C_{10}$, and that between n well 31 and p well 34 is $C_{20}$, $C_{10}$ is greater than $C_1$ of the conventional well structure shown in FIG. 27A. This is because the width of the depletion layer generated at the pn junction of n well 31 and high concentration p type buried layer 40 is smaller than that between semiconductor substrate 1 and n well 4 of the well structure of FIG. 27A, owing to the presence of a high concentration p type buried layer 40 between the semiconductor substrate and n well 31. Junction capacitance $C_{20}$ is substantially equal to that of $C_2$ of the conventional case.

Figure 12B:
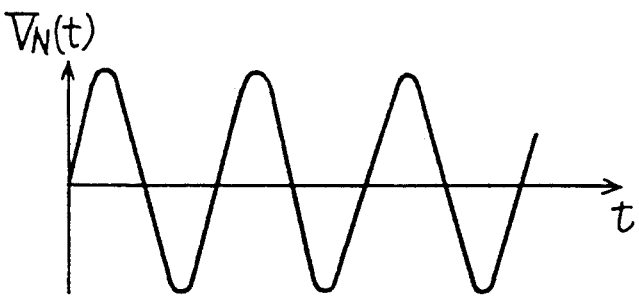
FIG. 12B is a graph showing the fashion of fluctuation of noise component $V_N(t)$.

The noise component $V_N(t)$ conveyed to p well 27, such as that shown in FIG. 12B accompanying supply voltage $V_{CC}$ applied to n well 29, has its value divided into resistor $R_N$ of N well 31 and junction capacitance $C_1$.

Figure 12C:
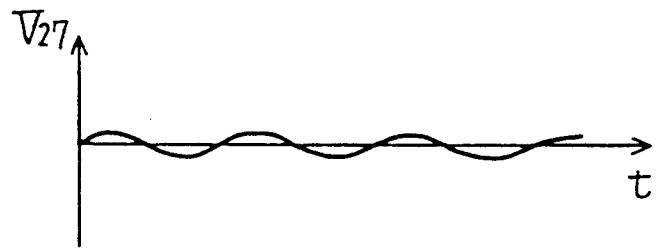
FIG. 12C is a graph showing the fashion of fluctuation of potential $V_{27}$ of p well 27.
Figure 13:
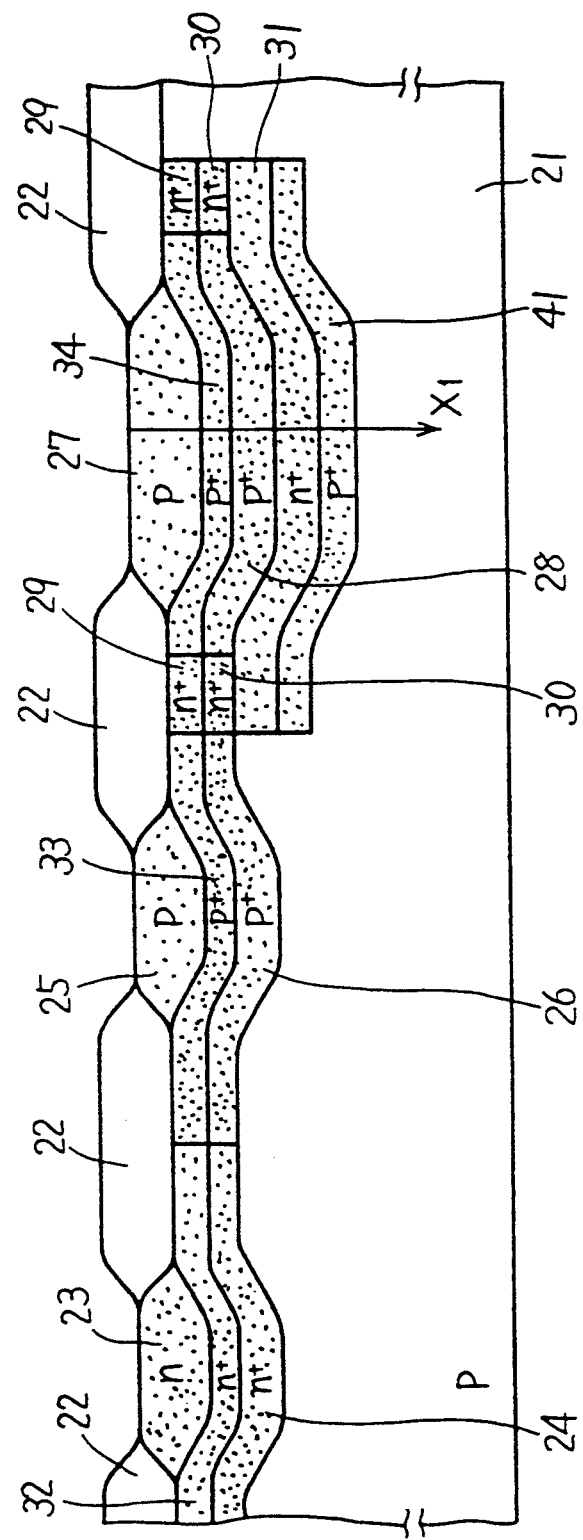
FIG. 13 is a sectional view of the well structure of another embodiment showing substantially the same effect of that of the second embodiment shown in FIG. 11.
Figure 27C:
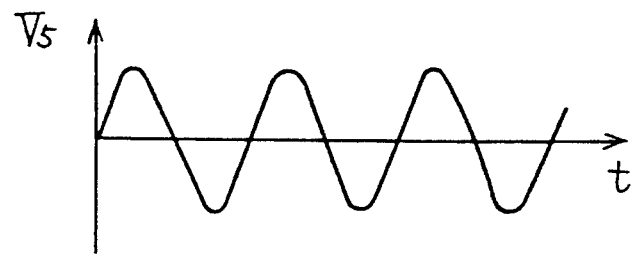
FIG. 27C is a graph showing the fluctuation of potential $V_5$ of n well 5.

In the well structure of the present embodiment, the increase of junction capacitance $C_{10}$ causes the ratio of junction capacitance $C_{10}$ of noise component $V_N(t)$ to become greater in comparison with a conventional case. Thus, fluctuation of potential $V_{27}$ of p well 27 is reduced drastically as shown in FIG. 12C in comparison with the conventional case of FIG. 27C. As a result, degradation of element characteristic occurring because of fluctuation of well potential in a conventional well structure due to the influence of supply noise is prevented.

High concentration p type buried layer 40 of the present embodiment is formed by implanting boron as the p type impurity all over semiconductor substrate 21 at an implantation energy of 1–3 MeV and a dosage of $10^{12}$–$10^{13}/cm^2$ prior to the formation steps of n wells 29, 30 and 31, and after the formation of element isolation region 22 described in the first embodiment.

Although high concentration p type buried layer 40 is formed extending over semiconductor substrate 21 in the first embodiment, a high concentration p type buried layer 41 having an impurity concentration and thickness similar to those of high concentration p type buried layer 40 may be formed only at the region below n well 31 to suppress potential fluctuation of p well 27 due to supply noise.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a semiconductor substrate having an active region defined in a surface thereof;
   as isolation oxide film formed on the surface of said semiconductor substrate for isolating said region;
   an upper well of a first conductivity type in said active region formed from the surface of said semiconductor substrate to a predetermined depth in said semiconductor substrate;
   a first conductivity type layer formed as a buried layer extending continuously along the entire area of said active region to enclose the bottom of said upper well of the first conductivity type;
   a lower well of the first conductivity type formed as a buried layer extending along the entire area of said active region to enclose the bottom of said first conductivity type layer, and
   a second conductivity type well of a predetermined thickness formed as a buried layer to enclose the bottom and the outer circumferential sidewall of said lower well of the first conductivity type and the outer circumferential sidewalls of said upper well of the first conductivity type and said first conductivity type layer of high concentration,
   wherein said first conductivity type layer has a concentration higher than that of said upper well of the first conductivity type.

2. The semiconductor device according to claim 1, wherein said upper well of the first conductivity type and said lower well of the first conductivity type have an impurity concentration of $10^{15}$–$10^{18}/cm^3$, and said first conductivity type layer of high concentration has an impurity concentration of $10^{16}$–$10^{22}/cm^3$.

3. The semiconductor device according to claim 1, wherein said second conductivity type well has an impurity concentration of $10^{16}$–$10^{19}/cm^3$.

4. The semiconductor device according to claim 1, further comprising a first conductivity type buried layer of high concentration of a predetermined thickness formed as a buried layer at least in the region beneath said second conductivity type well to be adjacent to the entire bottom of said second conductivity type well.

5. The semiconductor device according to claim 4, wherein said first conductivity type buried layer of high concentration has an impurity concentration of $10^{16}$–$10^{22}/cm^3$.

6. The semiconductor device according to claim 1, further comprising a memory cell of DRAM formed in said active region on said surface of said semiconductor substrate.

* * * * *